(12) United States Patent
Huang

(10) Patent No.: US 9,420,681 B1
(45) Date of Patent: Aug. 16, 2016

(54) SUBSTRATE STRUCTURE

(71) Applicants: Interface Optoelectronics (ShenZhen) Co., Ltd., Shenzhen (CN); General Interface Solution Limited, Miaoli County (TW)

(72) Inventor: Shih-Chieh Huang, Guangdong (CN)

(73) Assignees: INTERFACE OPTOELECTRONICS (SHENZHEN) CO., LTD., Shenzhen (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 14/742,721

(22) Filed: Jun. 18, 2015

(30) Foreign Application Priority Data

Mar. 5, 2015 (CN) .......................... 2015 1 0099000

(51) Int. Cl.
*H05K 1/03* (2006.01)
*H05K 1/02* (2006.01)

(52) U.S. Cl.
CPC ........................................ *H05K 1/02* (2013.01)

(58) Field of Classification Search
CPC ............ H05K 1/03; C22C 1/05; C23C 16/02; C23C 16/26; H01L 51/05; G03B 21/62
USPC ........ 174/255; 428/195.1, 200, 551; 313/518; 359/457; 29/595
See application file for complete search history.

(56) References Cited

U.S. PATENT DOCUMENTS

| | | | | | |
|---|---|---|---|---|---|
| 4,560,457 | A | * | 12/1985 | Ogawa | C09J 4/00 522/11 |
| 4,582,589 | A | * | 4/1986 | Ushizawa | G01N 27/3335 204/416 |
| 4,698,113 | A | * | 10/1987 | Ogawa | C09J 5/06 156/272.2 |
| 4,855,191 | A | * | 8/1989 | Arakawa | G03C 5/17 250/483.1 |
| 5,347,766 | A | * | 9/1994 | Komatsu | B24B 13/01 451/29 |
| 6,432,516 | B1 | * | 8/2002 | Terasaki | B32B 27/08 428/195.1 |
| 2002/0155312 | A1 | * | 10/2002 | Gates, Jr. | C23C 16/0218 428/551 |
| 2003/0126945 | A1 | * | 7/2003 | Liu | C22C 1/055 75/245 |
| 2004/0217704 | A1 | * | 11/2004 | Iwase | H01L 51/5237 313/518 |
| 2006/0150893 | A1 | * | 7/2006 | Uchida | C30B 19/12 117/30 |
| 2006/0233973 | A1 | * | 10/2006 | Nakamura | C08J 5/18 428/1.31 |
| 2007/0218218 | A1 | * | 9/2007 | Kataoka | C08B 3/16 428/1.31 |

(Continued)

*Primary Examiner* — Xiaoliang Chen
(74) *Attorney, Agent, or Firm* — CKC & Partners Co., Ltd.

(57) ABSTRACT

A substrate structure includes a substrate, a buffer layer, and a protecting layer. The substrate includes a side surface. The buffer layer is disposed between the side surface of the substrate and the protecting layer, and the hardness of the protecting layer is greater than the hardness of the buffer layer.

9 Claims, 2 Drawing Sheets

(56) References Cited

U.S. PATENT DOCUMENTS

| | | | | |
|---|---|---|---|---|
| 2008/0054785 | A1* | 3/2008 | Hayashi | B29C 65/14 313/483 |
| 2008/0149852 | A1* | 6/2008 | Shoji | B29C 66/82661 250/483.1 |
| 2008/0149953 | A1* | 6/2008 | Ando | H01L 33/0079 257/94 |
| 2009/0115321 | A1* | 5/2009 | Hayashi | H01L 51/5237 313/504 |
| 2009/0200930 | A1* | 8/2009 | Hayashi | H01L 27/3276 313/504 |
| 2010/0192634 | A1* | 8/2010 | Higuchi | B29C 66/7465 65/60.1 |
| 2011/0122493 | A1* | 5/2011 | Ogawa | G03B 21/62 359/457 |
| 2011/0315200 | A1* | 12/2011 | Asuka | B32B 17/10018 136/251 |
| 2012/0000527 | A1* | 1/2012 | Asuka | B32B 7/12 136/256 |
| 2012/0033155 | A1* | 2/2012 | Asano | G02B 1/105 349/62 |
| 2012/0171454 | A1* | 7/2012 | Kondo | B32B 17/10 428/220 |
| 2013/0019462 | A1* | 1/2013 | Shoji | G01T 1/2018 29/595 |
| 2014/0294347 | A1* | 10/2014 | Lin | G02B 6/12026 385/37 |

* cited by examiner

SUBSTRATE STRUCTURE

RELATED APPLICATIONS

This application claims priority to Chinese Application Serial Number 201510099000.6, filed Mar. 5, 2015, which is herein incorporated by reference.

BACKGROUND

1. Field of Invention

The present invention relates to a substrate structure.

2. Description of Related Art

In the field of touch panels and display panels, a wide range of substrates is often designed to carry various elements. After the substrates are assembled to form relevant actual products, it is often possible for the actual products to receive serious damage from being hit on the edges. For example, a fall of the product may result in a strike upon the edge. Since the edge of the substrate has a small area to accept the force, a small impact can still cause a great stress, and therefore it is easy to create a crack after such a strike. In long term, the crack may become larger and bring some problems in the practical operation of the relevant products.

SUMMARY

The present invention provides a substrate structure including a buffer layer and a protecting layer. The buffer layer absorbs the external shock for reducing the external force exerted on the substrate. The protecting layer protects the shell of the substrate and the buffer layer from peeling or being damaged due to the external shock. In this way, when getting hit by the external force, the substrate can be protected from being destroyed by the buffer layer and the protecting layer.

One aspect of the present invention provides a substrate structure, including a substrate, a buffer layer, and a protecting layer. The substrate includes a side surface. The buffer layer is disposed between the side surface and the protecting layer, and the hardness of the protecting layer is greater than the hardness of the buffer layer.

In one or more embodiments of the present invention, the substrate structure further includes an inner protecting layer disposed between the side surface and the buffer layer, and a hardness of the inner protecting layer is greater than the hardness of the buffer layer.

In one or more embodiments of the present invention, the hardness of the protecting layer is greater than the hardness of the inner protecting layer.

In one or more embodiments of the present invention, a thickness of the protecting layer is in a range from about 10 micrometers to about 100 micrometers.

In one or more embodiments of the present invention, a thickness of the buffer layer is in a range from about 30 micrometers to about 200 micrometers.

In one or more embodiments of the present invention, the hardness of the protecting layer is in a range from about 85 Shore D to about 95 Shore D, and the hardness of the buffer layer is in a range from about 30 Shore D to about 80 Shore D.

In one or more embodiments of the present invention, the substrate is a one-glass-solution touch screen.

In one or more embodiments of the present invention, the substrate includes at least one surface and at least one connective round surface, the surface is perpendicular to the side surface, and the connective round surface is disposed between the surface and the side surface for connecting the surface and the side surface, in which the buffer layer covers the connective round surface and the side surface.

In one or more embodiments of the present invention, the substrate includes at least one surface and at least one connective oblique surface, the surface is perpendicular to the side surface, and the connective oblique surface is disposed between the surface and the side surface for connecting the surface and the side surface, in which the buffer layer covers the connective oblique surface and the side surface, and the protective layer fully covers the buffer layer.

In one or more embodiments of the present invention, the substrate includes two strengthened layers on a top surface and a bottom surface of the substrate respectively.

BRIEF DESCRIPTION OF THE DRAWINGS

The invention can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Figure 1:
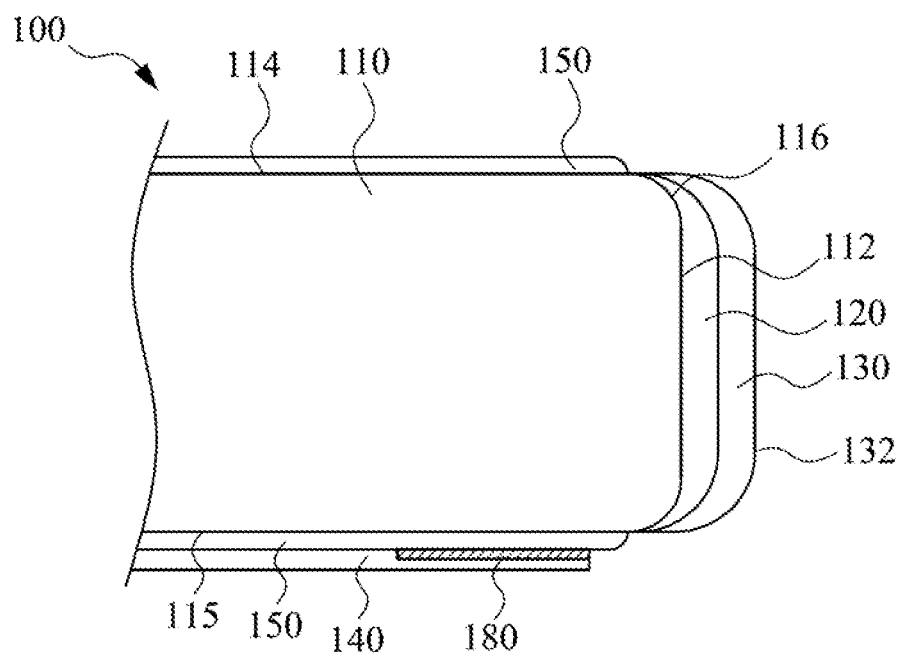
FIG. 1 is a cross-sectional view of the substrate structure according to one embodiment of the present invention.

FIG. 1 is a cross-sectional view of the substrate structure 100 according to one embodiment of the present invention. The substrate structure 100 includes a substrate 110, a buffer layer 120, and a protecting layer 130. The substrate 110 includes a side surface 112. The buffer layer 120 is disposed between the side surface 112 and the protecting layer 130, and the hardness of the protecting layer 130 is greater than the hardness of the buffer layer 120.

In this embodiment, the substrate 110 includes at least one surface 114 and at least one connective round surface 116, the surface 114 is perpendicular to the side surface 112, and the connective round surface 116 is disposed between the surface 114 and the side surface 112 for connecting the surface 114 and the side surface 112. The connective round surface 116 can be formed by plural steps in the processing of the substrate, such as cutting, computer numerical control (CNC) processing, edge polishing, hydrofluoric acid etching, re-strengthening, etc. Herein, the size and curvature of the connective round surface 116 can be designed in accordance with the requirements of actual situation.

In one or more embodiments of the present invention, the substrate 110 can be a touch glass or a thin film transistor (TFT) glass. Especially, the substrate can be a one-glass-solution (OGS) touch screen. Through one glass, the OGS touch screen achieves dual effects simultaneously, which are to protect the glass, and to sense the touch.

The substrate structure 100 can optionally include strengthened layers 150, an electrode layer 140, and a light-shielding layer 180. The substrate 110 includes a surface 115 disposed opposite the surface 114. By a strengthening process, the strengthened layers 150 is disposed on the surface 114 and the surface 115 of the substrate 110 to enhance the hardness of the substrate 110. In one or more embodiments of the present invention, the strengthened layers 150 can fully cover the surface 114 and the surface 115 of the substrate 110, and prevent the surface 114 and the surface 115 from being exposed.

After forming the strengthened layers 150, the light-shielding layer 180 can be formed on one of the strengthened layers 150. Then, the electrode layer 140 is formed on a side of the light-shielding layer 180 opposite the substrate 110. It is noted that neither the electrode layer 140 nor the light-shielding layer 180 are necessary configurations, and the substrate 110 can be an ordinary glass without the configuration of electrodes.

In one or more embodiments of the present invention, the hardness of the protecting layer 130 is in a range from about 85 Shore D to about 95 Shore D, and the hardness of the buffer layer 120 is in a range from about 30 Shore D to about 80 Shore D. In addition, the surface 132 of the protecting layer 130 is configured with a surface hardness greater than a pencil hardness of 3H.

In the configuration of materials, the materials of the protecting layer 130 can be epoxy gels, and the materials of the buffer layer 120 can be acrylic gels. Both the protecting layer 130 and the buffer layer 120 can be formed by applying the material on the side surface 112 and the connective round surface 116 with the use of sprays or dispensers. Of course, it is fine to spray plural substrates at the same time, thereby reaching the purposes of mass production.

In one or more embodiments of the present invention, a thickness of the protecting layer 130 is in a range from about 10 micrometers to about 100 micrometers. A thickness of the buffer layer 120 is in a range from about 30 micrometers to about 200 micrometers. Though the sum thickness of the protecting layer 130 and the buffer layer 120 is in a range from about 40 micrometers to about 300 micrometers, ideally, the sum thickness of the protecting layer 130 and the buffer layer 120 is in a range from about 40 micrometers to about 250 micrometers. It should be understood that, the diagrams provided by the present invention are only used to schematically illustrate the concepts of the embodiments of the present invention. The relative size depicted in the diagrams, such as thickness, length, etc. should not be used to limit the scope of the present invention.

In this embodiment, the buffer layer 120 covers the side surface 112 and the connective round surface 116, and the protecting layer 130 fully covers the buffer layer 120 and prevents the buffer layer 120 from being exposed. In other words, the side surface 112 and the connective round surface 116 are at least protected by dual layers, the buffer layer 120 and the protecting layer 130. The buffer layer 120 is substantially limited between the protecting layer 130 and the connective round surface 116, and between the protecting layer 130 and the side surface 112.

Ideally, the strengthened layers 150 can be connected with the buffer layer 120 and the protecting layer 130, and therefore a consecutive strengthened structure is formed on the surface 114, the side surface 112, and the connective round surface 116 of the substrate 110. In this way, the substrate 110 is totally surrounded and wrapped by the strengthened structure. However, it should not limit the scope of the present invention. The strengthened layers 150 can be disconnected from the buffer layer 120 and the protecting layer 130.

In this embodiment, the surface 114, the side surface 112, and the connective round surface 116 of the substrate 110 are effective surrounded and protected by the strengthened layers 150, the buffer layer 120, and the protecting layer 130, and therefore are prevented from the direct strike.

Generally, when the substrate 110 is hit, since the side surface 112 and the connective round surface 116 has a small area to accept the external shock, damage easily occurs due to huge pressures. In this embodiment, for the shock on the side surface, the dual-layer protection of the buffer layer 120 and the protecting layer 130 can reduce the force impacted on the side surface 112 and the connective round surface 116.

To be specific, the surface 132 of the protecting layer 130 with a higher hardness accepts the shock, and disperses the shock from a dot to an area to distract the intensity. Then, the buffer layer 120 deforms to absorb the shock from the protecting layer 130 to reduce the intensity of the shock. The final force exerted on the side surface 112 and the connective round surface 116 has been distracted and reduced, and therefore the impact force greatly decreases.

Herein, since the surface 132 of the protecting layer 130 has the higher surface hardness, therefore the surface 132 has an anti-scratch effect. Also, the protective layer 130 with the high hardness can protect the buffer layer 120 from being scratched or peeling and thereto being destroyed due to external collision.

Though the composite structure of dual layers are introduces herein, it should not limit the scope of the present invention. In some embodiment, plural buffer layers 120 and protective layers 130 can be configured in the substrate structure with an adequate stack sequence, and the substrate structure can also reach the effect of reducing the impact force.

Figure 2:
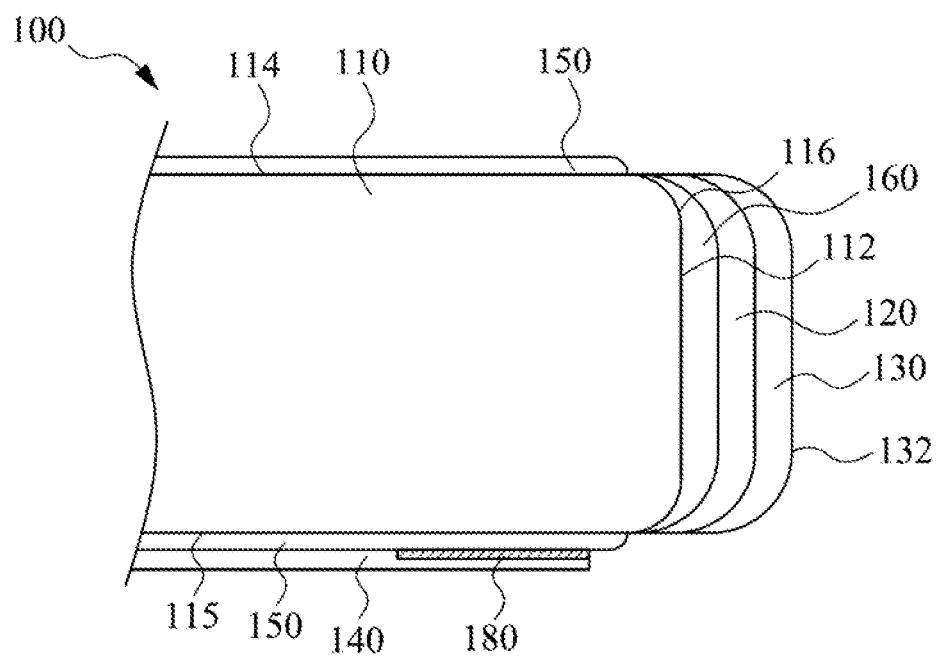
FIG. 2 is a cross-sectional view of the substrate structure according to another embodiment of the present invention.

FIG. 2 is a cross-sectional view of the substrate structure 100 according to another embodiment of the present invention. This embodiment is similar to the embodiment of FIG. 1, and the difference is that: in this embodiment, the substrate structure 100 further includes an inner protecting layer 160 disposed between the side surface 112 and the buffer layer 120. The hardness of the protecting layer 130 is greater than or equal to the hardness of the inner protecting layer 160, and a hardness of the inner protecting layer 160 is greater than the hardness of the buffer layer 120.

In this embodiment, the inner protecting layer 160 covers the side surface 112 and the connective round surface 116, and the buffer layer 120 fully covers the inner protecting layer 160, preventing the inner protecting layer 160 from being exposed. Then, the protecting layer 130 also fully covers the buffer layer 120, preventing the buffer layer 120 from being exposed. In other words, the side surface 112 and the connective round surface 116 are protected by at least three layers, which are inner protecting layer 160, buffer layer 120, and the protecting layer 130. The inner protecting layer 160 is substantially limited between the buffer layer 120 and the connective round surface 116, and between the buffer layer 120 and the side surface 112. The buffer layer 120 is substantially limited between the protecting layer 130 and the inner protecting layer 160.

In this embodiment, the protecting layer 130 and the inner protecting layer 160 can be made of the same materials. On the other hand, the protecting layer 130 and the inner protecting layer 160 can be made of different materials having high hardness, in which the materials of the protecting layer 130 have high surface hardness. Ideally, a thickness of the inner protecting layer 160 is in a range from about 20 micrometers to about 100 micrometers, and a sum thickness of inner protecting layer 160, the protecting layer 130, and the buffer layer 120 is preferably in a range from about 40 micrometers to about 200 micrometers. Other configurations of the hardness and thickness of the buffer layer 120 and the protecting layer 130 of this embodiment are substantially the same as the embodiment of FIG. 1, and therefore not repeated herein.

In this embodiment, through the three-layer protection of the buffer layer 120, the protecting layer 130, and the inner protecting layer 160, the side surface 112 and the connective round surface 116 are prevented from being hit directly. To be specific, the surface 132 of the protecting layer 130 with the higher surface hardness accepts the shock, and disperses the shock from a dot to an area to distract the intensity. Next, the buffer layer 120 deforms to absorb the impact to reduce the intensity of the shock. Then, the inner protecting layer 160 with a higher hardness disperses the shock. The final force exerted on the side surface 112 and the connective round surface 116 has been distracted, reduced, and distracted again, and therefore the impact force has been greatly decreased.

Herein, since the surface 132 of the protective layer 130 has the higher surface hardness, the surface 132 has an anti-scratch effect. The protective layer 130 with the high hardness can protect the buffer layer 120 from peeling and being destroyed due to external collision, and the inner protective layer 160 with the high hardness can protect the substrate 110 from peeling and being destroyed due to external collision.

Other details of this embodiment are substantially the same as the embodiment of FIG. 1, and thereto not repeated herein.

Figure 3:
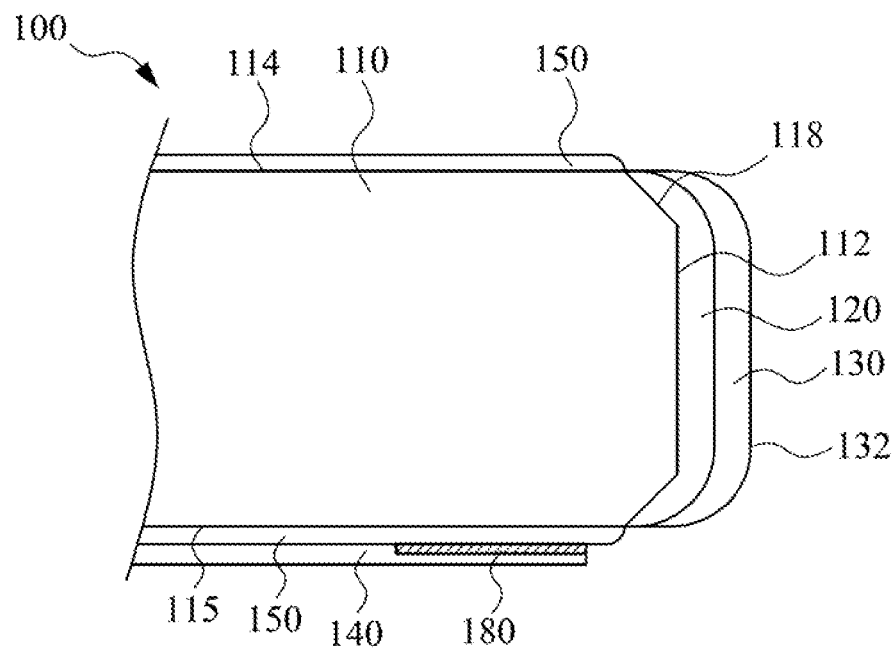
FIG. 3 is a cross-sectional view of the substrate structure according to another embodiment of the present invention.

FIG. 3 is a cross-sectional view of the substrate structure 100 according to another embodiment of the present invention. This embodiment is similar to the embodiment of FIG. 1, and the difference is that: in this embodiment, the substrate 110 includes a connective oblique surface 118 instead of the connective round surface 116 (referring to FIG. 1). The connective oblique surface 118 is disposed between the surface 114 and the side surface 112 for connecting the surface 114 and the side surface 112.

In this embodiment, the buffer layer 120 covers the side surface 112 and the connective oblique surface 118, and the protecting layer 130 fully covers the buffer layer 120, preventing the buffering layer 120 from being exposed. In other words, the side surface 112 and the connective oblique surface 118 are at least protected by dual layers, the buffer layer 120 and the protecting layer 130. The buffer layer 120 is substantially limited between the protecting layer 130 and the connective oblique surface 118, and between protecting layer 130 and the side surface 112.

In this embodiment, the connective oblique surface 118 can be formed by plural steps in the processing of the substrate, such as cutting, computer numerical control (CNC) processing, etc. The size and slope of the connective oblique surface 118 can be designed in accordance with the requirements of actual situation. Comparing to the connective round surface 116 (referring to FIG. 1), the connective oblique surface 118 can be fabricated without the steps of polishing and etching, and therefore the steps in the processing of the substrate can be simplified.

Furthermore, the configuration of the connective oblique surface 118 can affect the shapes of the buffer layer 120 and the protecting layer 130. As illustrated previously, the protecting layer 130 and the buffer layer 120 can be formed on the side surface 112 and the connective round surface 116 by spraying or dispensing, and therefore the shapes of the buffer layer 120 and the protecting layer 130 are influenced by the connective oblique surface 118 and the side surface 112. In this way, how the buffer layer 120 and the protecting layer 130 accept the impact force is influenced. For example, the tilt angle of the connective oblique surface 118 can be designed to be larger, and the buffer layer 120 and the protecting layer 130 at the connective oblique surface 118 can be designed to be thicker, thereby enhancing the ability of the connective oblique surface 118 to withstand the shock.

Other details of this embodiment are substantially the same as the embodiment of FIG. 1, and thereto not repeated herein.

Figure 4:
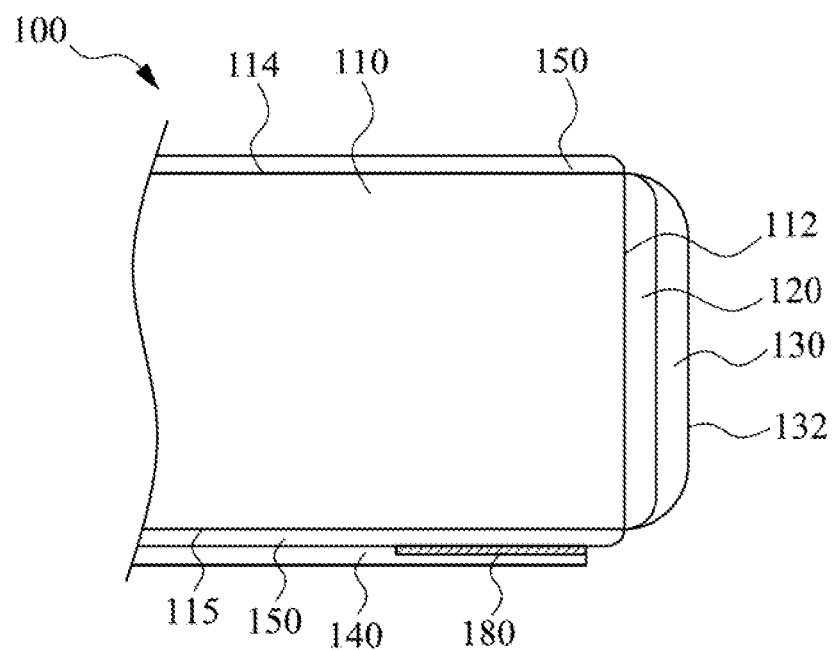
FIG. 4 is a cross-sectional view of the substrate structure according to another embodiment of the present invention.

FIG. 4 is a cross-sectional view of the substrate structure 100 according to another embodiment of the present invention. This embodiment is similar to the embodiment of FIG. 1, and the difference is that: in this embodiment, the surface 114 and the side surface 112 are connected directly, and the substrate 110 does not include the connective round surface 116 (referring to FIG. 1).

In this embodiment, the buffer layer 120 covers the side surface 112, and the protecting layer 130 fully covers the buffer layer 120, preventing the buffer layer 120 from being exposed. In other words, the side surface 112 is at least protected by dual layers, the buffer layer 120 and the protecting layer 130. The buffer layer 120 is substantially limited between the protecting layer 130 and the side surface 112.

Comparing to the previous embodiments, since the substrate structure 100 of this embodiment is configured with neither the connective round surface 116 (referring to FIG. 1) nor the connective oblique surface 118 (referring to FIG. 3), the plural steps in the fabrication process can be simplified. Moreover, since the buffer layer 120 and the protecting layer 130 are only attached to the side surface 112, the buffer layer 120 and the protecting layer 130 can be designed to include a uniform thickness and shape. Comparing to the previous embodiments, the configuration of this embodiment can minify the volume occupied by the buffer layer 120 and the protecting layer 130, and therefore the substrate structure 100 can be applied to panel structures with limited space.

Other details of this embodiment are substantially the same as the embodiment of FIG. 1, and thereto not repeated herein.

The present invention provides a substrate structure including a buffer layer and a protecting layer. The buffer layer absorbs the external shock for reducing the external force exerted on the substrate. The protecting layer protects the shell of the substrate and the buffer layer from peeling or being damaged due to the external shock. In this way, when getting hit by an external force, the substrate can be protected from being destroyed by the buffer layer and the protecting layer.

Although the present invention has been disclosed in the above embodiments, but it should not be used to limit the present invention. It will be apparent to those skilled in the art that various modifications and variations can be made to the present invention without departing from the scope or spirit of the invention. In view of the foregoing, it is intended that the scope of present invention is defined in the following claims.

What is claimed is:

1. A substrate structure, comprising:
    a substrate comprising a top surface, a bottom surface and a side surface disposed between the top surface and the bottom surface, and the substrate further comprising two strengthened layers on the top surface and the bottom surface of the substrate respectively;
    a buffer layer; and
    a protecting layer, wherein the buffer layer is disposed between the side surface and the protecting layer, and a hardness of the protecting layer is greater than a hardness of the buffer layer.

2. The substrate structure of claim 1, further comprising an inner protecting layer disposed between the side surface and the buffer layer, wherein a hardness of the inner protecting layer is greater than the hardness of the buffer layer.

3. The substrate structure of claim 2, wherein the hardness of the protecting layer is greater than the hardness of the inner protecting layer.

4. The substrate structure of claim 1, wherein a thickness of the protecting layer is in a range from about 10 micrometers to about 100 micrometers.

5. The substrate structure of claim 1, wherein a thickness of the buffer layer is in a range from about 30 micrometers to about 200 micrometers.

6. The substrate structure of claim 1, wherein the hardness of the protecting layer is in a range from about 85 Shore D to about 95 Shore D, and the hardness of the buffer layer is in a range from about 30 Shore D to about 80 Shore D.

7. The substrate structure of claim 1, wherein the substrate is a one-glass-solution touch screen.

8. The substrate structure of claim 1, wherein the substrate comprises at least one surface and at least one connective round surface, the surface is perpendicular to the side surface, and the connective round surface is disposed between the surface and the side surface for connecting the surface and the side surface, wherein the buffer layer covers the connective round surface and the side surface.

9. The substrate structure of claim 1, wherein the substrate comprises at least one surface and at least one connective oblique surface, the surface is perpendicular to the side surface, and the connective oblique surface is disposed between the surface and the side surface for connecting the surface and the side surface, and wherein the buffer layer covers the connective oblique surface and the side surface, and the protective layer fully covers the buffer layer.

\* \* \* \* \*